United States Patent [19]

Tarhay et al.

[11] Patent Number: 5,011,706
[45] Date of Patent: Apr. 30, 1991

[54] METHOD OF FORMING COATINGS CONTAINING AMORPHOUS SILICON CARBIDE

[75] Inventors: Leo Tarhay, Sanford; Kenneth G. Sharp, Midland, both of Mich.

[73] Assignee: Dow Corning Corporation, Midland, Mich.

[21] Appl. No.: 336,927

[22] Filed: Apr. 12, 1989

[51] Int. Cl.$^5$ .................... B05D 3/06; C23C 16/32; C23C 16/50
[52] U.S. Cl. .................... 427/39; 427/249; 427/255.2; 437/100; 136/258
[58] Field of Search .................... 437/100, 235, 243; 136/258 AM; 427/39, 249, 255.2; 428/446, 450; 148/DIG. 148; 357/71

[56] References Cited

U.S. PATENT DOCUMENTS

| | | | |
|---|---|---|---|
| 3,400,309 | 9/1968 | Doo | 357/49 |
| 4,000,054 | 12/1976 | Marcantonio | 204/192.17 |
| 4,362,766 | 12/1982 | Dannhauser et al. | 427/39 |
| 4,554,180 | 11/1985 | Hirooka | 427/248.1 |
| 4,564,533 | 1/1986 | Yamazaki | 427/39 |
| 4,683,145 | 7/1987 | Nishimura et al. | 427/36 |

FOREIGN PATENT DOCUMENTS

2132817A  7/1984  United Kingdom ................ 437/100

OTHER PUBLICATIONS

J. R. Gardiner et al., *IBM Tech. Disc. Bull.*, vol. 10, No. 5, Oct. 1967, pp. 655-656.
K. Tachibana et al., *Symp. Proc. 7th Int. Symp. Plasma Chem.*, 588-593 (1985).
T. Barton & N. Tillman, *J. Am. Chem. Soc.*, 109, 6711 (1987).
R. Conlin & R. Gill, *J. Am. Chem. Soc.*, 105, 618 (1983).
Pola et al., *J. Organomet. Chem.* 341, C13 (1988).
J. Laane, *J. Am. Chem. Soc.*, 89, 1144 (1967).
A. Mal'tsev et al., *Doklady Akademii Nauk SSSR*, vol. 247, No. 2, pp. 383-387, Jul., 1979.
C. Golino et al., *J. Am. Chem. Soc.* 97, 7371 (1975).

*Primary Examiner*—Aaron Weisstuch
*Attorney, Agent, or Firm*—James E. Bittell

[57] ABSTRACT

The invention is a method of forming a continuous coating of amorphous silicon carbide on the surface of articles by plasma enhanced chemical vapor deposition. In the method, the chemical vapor comprises a silicon-containing cyclobutane, such as a silacyclobutane or a 1,3-disilacyclobutane. The coatings formed by the invention are useful for application to solar cells, for preventing corrosion of electronic devices, for forming interlevel dielectric layers between metallization layers of electronic devices, and for providing abrasion resistance to surfaces.

14 Claims, No Drawings

METHOD OF FORMING COATINGS CONTAINING AMORPHOUS SILICON CARBIDE

BACKGROUND OF THE INVENTION

This invention relates to plasma induced decomposition of silicon-containing cyclobutanes to form continuous coatings coatings have useful properties such as corrosion resistance and abrasion resistance and are highly electrically insulating.

A number of chemical vapors are known to be useful for forming films or coatings by plasma induced reactions and corresponding deposition onto a substrate. For example, it is known to produce films containing silicon and carbon by the plasma induced reaction of mixtures of silane ($SiH_4$) and a hydrocarbon such as methane or ethane. The films produced by such processes often contain residual hydrogen as well as silicon and carbon and may be referred to as "hydrogenated silicon carbide". Such films are also commonly described as "amorphous silicon carbide" and may also contain an excess of either carbon or silicon relative to the stoichiometric proportion.

Hydrogenated silicon carbide films find their principal application in photovoltaic devices, where they serve as relatively large band gap "windows" in the top layer of a solar cell. Their advantages for this use include a relatively low and adjustable absorption of visible radiation and the ability for doped material to make a good ohmic contact with the collection electrodes.

One problem associated with formation of hydrogenated silicon carbide films by such methods results from the differing rates of decomposition of silane and hydrocarbons in plasmas. For example, K. Tachibana et al., Symp. Proc. 7th Int. Symp. Plasma Chem., 588–93 (1985), teaches using a large excess of the hydrocarbon in order to overcome the disparity in reactivity of the hydrocarbon relative to silane. Also, silane is a very hazardous chemical which requires the utmost caution and consideration for safety during it use.

Silacyclobutane and disilacyclobutane as well as many of their derivatives are known materials. The thermal decompositions and reactions of these materials have been studied extensively in academic circles because of the substantial theoretical interest in the silene ($H_2Si=CH_2$) and silylene ($H_3CSiH$) intermediates produced upon thermolysis of these materials. For example, T. Barton and N. Tillman, J. Am. Chem. Soc. 109, 6711 (1987), describe studies of the flash vacuum pyrolysis of 1,1-dideuteriosilacyclobutane wherein gaseous products of the pyrolysis are identified. R. Conlin and R. Gill, J. Am. Chem. Soc. 105, 618 (1983), report that silacyclobutane decomposes into ethylene, silene, and several silyenes at temperatures above 400° C.

Pola et al., J. Organomet. Chem. 341, C13 (1988), describe a gas-phase reaction of 1-methyl-1-silacyclobutane initiated by infrared radiation from a carbon dioxide laser. These workers observed deposition of a transparent "organosilicon polymer" on cold surfaces and proposed that a gas phase polymerization had occurred. The characteristics of the "organosilicon polymer" described by Pola et al. suggest that it has appreciable organic groups present (particularly methyl groups) so that it is substantially different from the hydrogenated silicon carbide coatings obtained by plasma induced reaction of mixtures of silane and a hydrocarbon as described above.

SUMMARY OF THE INVENTION

One object of the present invention is to provide an efficient and safe method of depositing coatings containing amorphous silicon carbide on the surface of structures. The invention is a method of forming a continuous coating on a structure, the method comprising a first step of introducing a vapor into an evacuated chamber containing the structure. A sufficient quantity of vapor is introduced to provide a vapor pressure in the chamber of 0.001 to 300 Torr. The vapor comprises a silicon-containing cyclobutane selected from the group consisting essentially of silacyclobutanes represented by the formula

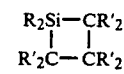

and 1,3-disilacyclobutanes represented by the formula

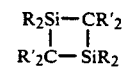

where, in both formulas, each R is independently selected from the group consisting of hydrogen, fluorine, and hydrocarbon radicals having 1 to 4 carbon atoms and each R' is independently selected from the group consisiting of hydrogen and hydrocarbon radicals having 1 to 4 carbon atoms.

In the second step, decomposition of the silicon-containing cyclobutane is induced in the chamber by effecting a plasma discharge within the chamber. The plasma discharge initiates a decomposition reaction of the silicon-containing cyclobutane that results in deposition of a coating containing amorphous silicon carbide on the surface of the structure positioned within the chamber.

DETAILED DESCRIPTION OF THE INVENTION

The invention is a method of forming continuous coatings on the surface of articles. The coatings are formed on articles in a chemical vapor deposition process wherein reactions of the chemical vapor are induced by a plasma discharge. More specifically, the plasma discharge induces decomposition reactions of the chemical vapor which lead to deposition of the decomposition products onto the surface of articles located near to the area in which the reactions occur.

The chemical vapors or source gases which are used in the present method are silicon-containing cyclobutanes. More specifically the source gases are cyclobutanes in which one or more of the carbon atoms of the ring have been replaced by silicon atoms. Cyclobutanes with one silicon atom include silacyclobutanes represented by the formula

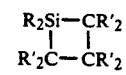

where each R is independently selected from the group consisting of hydrogen, fluorine, and hydrocarbon radicals having 1 to 4 carbon atoms and each R' is independently selected from the group consisting of hydrogen and hydrocarbon radicals having 1 to 4 carbon atoms. For example, useful silacyclobutanes include the parent compound silacyclobutane ($H_2SiC_3H_6$) and derivatives such as 1,1-difluorosilacyclobutane, 1-methylsilacyclobutane, 1,1-dimethylsilacyclobutane, 1,1-ethylmethylsilacyclobutane, 1-butylsilacyclobutane, 2,4-dimethylsilacyclobutane, 3,3-diethylsilacyclobutane, and 3,3-ethylpropylsilacyclobutane.

Cyclobutanes with two silicon atoms include 1,3-disilacyclobutanes represented by the formula

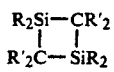

where each R and R' has the same meaning as described previously. For example, useful 1,3-disilacyclobutanes include the parent compound 1,3-disilacyclobutane and derivatives such as
1,1,3,3-tetrafluoro-1,3-disilacyclobutane,
1-methyl-1,3-disilacyclobutane,
1,3-dimethyl-1,3-disilacyclobutane,
1,1-ethylmethyl-1,3-disilacyclobutane,
1-butyl-1,3-disilacyclobutane,
2,4-dimethyl-1,3-disilacyclobutane,
2,2-diethyl-1,3-disilacyclobutane, and
2,4-ethylpropyl-1,3-disilacyclobutane.

While it should be apparent to one skilled in the art that other volatile silicon-containing cyclobutanes may function equivalently as source gases in the method of this invention, it is believed that the silacyclobutanes and 1,3-disilacyclobutanes are preferable because of their ease of handling and more ready availability. The most preferred source gas for use in the invention may vary to some extent depending on the coating composition desired and the intended use of the coating. For example, if it is preferred to have a coating containing fluorine in the silicon-carbon matrix, then a chemical vapor such as 1,1-difluorosilacyclobutane or 1,1,3,3-tetrafluoro-1,3-disilacyclobutane would be selected. When a coating composition is desired containing silicon and carbon essentially to the exclusion of other components, then it is preferred to use source gases such as silacyclobutane and 1,3-disilacyclobutane.

As stated previously, the silacyclobutane and 1,3-disilacyclobutane as well as their derivatives are known materials. For example, the preparation of silacyclobutane from 1,1-dichlorosilacyclobutane by lithium aluminum hydride reduction is described by J. Laane, *J. Am. Chem. Soc.* 89, 1144 (1967).

The chemical vapor introduced into the plasma discharge can consist solely of a silicon-containing cyclobutane or it can be a mixture of a silicon-containing cyclobutane with other gases. Of course, mixtures of more than one of the silicon-containing cyclobutane species may also be used in the method. Also the silicon-containing cyclobutanes can be mixed with inert carrier gases such as argon and helium. The silicon-containing cyclobutane can also be mixed with other gases to modify the composition of the coating material deposited by the method of the invention. For example, hydrogen can be mixed with the silicon-containing cyclobutane to reduce the amount of hydrogen present in the coating material deposited. The hydrogen gas is believed to react in the plasma to form a species which removes hydrogen from the coating constituents as the coating is being deposited.

The pressure of the gases in the chamber where the plasma discharge is established should be controlled to a level which facilitates the plasma discharge and provides a reasonable rate of coating deposition. The pressures can be varied over a wide range depending on the specific plasma frequency used. Generally, total pressures in the range of 0.001 to about 300 Torr provide favorable conditions for the deposition process. Total pressures in the range of 0.01 to 20 Torr are preferred with total pressures of 0.01 to 1 Torr being most preferred.

The amount of chemical vapor introduced into the chamber containing the plasma discharge should be sufficient to provide a suitable pressure as described above. Accordingly the amount of vapors introduced should be adjusted to provide a total pressure in the chamber of 0.001 to 300 Torr. The process can be conducted under static conditions, but it is usually preferred to continuously introduce a controlled amount of vapor into one portion of a chamber while drawing a vacuum from another site in the chamber so as to cause flow of the vapor through the area of the plasma discharge. Again a sufficient quantity of the vapor is continuously introduced to provide a vapor pressure in the chamber of from about 0.001 to about 300 Torr while any carrier gases, gaseous products or other modifying gases are continuously drawn out of the chamber at a corresponding rate.

Any type of plasma discharge appropriate for this pressure range can be used in the present invention. The plasma discharge can be produced by either alternating or direct current. Generally, frequencies of about 25 KHz to about 3 GHz are preferred when using alternating current. Accordingly, useful plasmas include audio, radio and microwave frequency plasmas.

The character and properties of the coating deposited by the method of this invention has been found to vary depending on the temperature of the article being coated. Coatings can be applied when the temperature of the surface being coated is anywhere from about 20° C. to about 600° C. However, coatings produced at lower temperatures tend to be less resistant to corrosion.

Accordingly, when coatings produced by the present invention are intended to be used to protect the substrate from corrosion, it is preferred to heat the surface of the substrate to a temperature above about 200° C. during coating deposition. On the other hand when temperature sensitive articles are being coated it is important to be able to deposit an effective coating on the substrate at a temperature that does not cause damage to the article. When temperature sensitive electronic devices are coated for protection from environmental corrosion, it is preferred to heat the surface of the substrate to a temperature of from about 200° C. to about 350° C. The particular method of heating the substrate surface is not critical so that it can be heated by conduction, convection, or radiation methods.

The precise position of the article being coated is not crucial to the coating method of this invention. The article only need be in the chamber and preferably proximate to the area where the plasma discharge occurs. The surface being coated may be within or without the actual plasma discharge. When the reaction chamber is configured to provide flow of the chemical vapors through the plasma, it is preferred to either position the structure to be coated directly in the plasma discharge or at a position proximate to the plasma discharge at a point down-flow from the plasma discharge. Either positioning generally provides efficient and rapid deposition of the coating.

Generally, little if any nucleation and formation of solid powder reaction products is observed in the process of this invention. However, if nucleation occurs with formation of powder, it is preferred to adjust the position of the surface being coated to minimize impact or contact of such powder with the surface being coated. For instance, the surface may be positioned in an inverted alignment so that any powder tends to fall away from the surface instead of being directed into the surface.

The coatings of the present invention are useful for coating or depositing films on many types of objects. For example, many of the amorphous silicon carbide films deposited by this method are highly electrically resistive and display optical band gaps in the approximate range of 1.8 to 2.5 eV making them suitable for use in fabrication of solar cells. Similarly, films deposited by this method can be used as a dielectric layer between metallization layers in electronic devices. Such multilayer electronic devices contain multiple layers of metallization and interlevel layers which isolate electronic functions occurring in the metallization layers. Such devices can be fabricated by application of an amorphous silicon carbide coating over a metallization layer followed by application of another metallization pattern to the amorphous silicon carbide layer. The sequence can be repeated to build electronic devices with any number of electrically-isolated metallization layers.

The coatings are also useful for protecting articles from corrosion by acidic or chloride salt containing materials. Accordingly, the coatings are useful for protecting sensitive electronic devices and may be applied directly to the surface of a device or may be applied over other protective coating layers already present. One of the preferred method of protecting electronic devices is to apply an amorphous silicon carbide coating by the method of this invention over a previously applied planarizing layer of silica. The combination of the two layers provides improved protection against environmental contaminates.

It is one of the advantages of the present method that coatings can be applied to electronic devices while the temperature of the devices are relatively low. For example, some newer electronic devices containing gallium arsenide components are extremely sensitive to heat such that they can only withstand a maximum temperature of 350° C. for about 30 minutes. Thus the lower substrate temperatures and high rates of coating deposition available with the present method are particularly advantageous in coating such electronic devices. The coatings can also be applied to other heat sensitive substrates such as plastic materials including, for example, polyimides, epoxides, polytetrafluoroethylene and copolymers thereof, polycarbonates, acrylics and polyesters.

The coatings formed by the method of this invention are resistant to abrasion and can be used to protect the surface of articles from abrasion. For example, plastic articles may be coated to prevent abrasion of the plastic surface. Abrasion protection is particularly important for clear plastic articles where surface abrasion results in undesirable loss of clarity of the article.

The following examples are provided so that the invention may be more readily understood. The examples are intended to illustrate the invention, but are not to be taken as limiting the scope thereof.

The surfaces of glass articles were generally cleaned in an alkaline detergent solution, rinsed with deionized water, and dried with Freon® 12 prior to coating. Silicon wafers with aluminum metallization and electronic devices were either coated as received or cleaned using argon plasma just prior to coating. All parts and percentages are stated by weight unless otherwise specified.

EXAMPLE 1

This example illustrates an embodiment of the invention wherein the coating is formed on an article in a reactor heated externally such that the walls of the reactor and the article to be coated are at essentially a uniform temperature. A borosilicate glass tube was fitted internally with opposing rectangular metal electrodes which were admitted via vacuum feedthroughs. One end of the tube was fitted with a vapor feed system including mass flow meters so that the flow rate of multiple vapor feeds could be independently controlled. The tube was also fitted with sensors to monitor the pressure within the reactor. The other end of the tube was connected to a vacuum system employing a diffusion pump with a capacity of 200 L/s. The glass tube was externally heated with a tube furnace.

A Corning 7059 glass slide was positioned in the tube between the electrodes. The tube was heated to 350° C. and evacuated for about 30 min to reach a background vacuum level in the range of $1 \times 10^{-6}$ torr. A flow of 5 standard cc/min each of silacyclobutane and argon was passed through the tube for 15 min at a pressure of 0.1 torr while a plasma discharge at 125 kHz with a power density of 0.34 w/cm$^2$ was sustained between the electrodes. Upon completion of the deposition process, the tube was backfilled with nitrogen to atmospheric pressure.

The glass slide which was removed from the tube contained an adherent coating of a continuous yellow film. The coating was 1080 nm thick as determined by ellipsometry and had a refractive index of 2.35. The dark conductivity of the coating was determined to be equal to or less than about $10^{-14}$ S/cm.

EXAMPLE 2

This example illustrates the effectiveness of films deposited by this invention as coatings for protecting against corrosive materials.

A silicon wafer with an aluminum grid on its surface was coated in the apparatus described in Example 1. The tube was heated to 250° C. and evacuated for about 30 min to reach a background vacuum level in the range of $1 \times 10^{-6}$ torr. A flow of 5 standard cc/min of silacyclobutane was passed through the tube for 7.5 min at a pressure of 0.1 torr while a plasma discharge at 125 kHz with a power density of 0.25 w/cm$^2$ was maintained between the electrodes. The coating formed on the wafer was 650 nm thick.

The coated wafer was then exposed to a corrosive mixture of phosphoric, nitric and acetic acids, per MIL-STD 883C (Method 2021.3, Procedure B). After a period of 30 min exposure, there was no indication of pinholes, loss of adhesion or other perceptible effect on either the coating or aluminum metallization layer. Similar exposure of an uncoated wafer results in rapid attack of the aluminum by the acid mixture.

The elemental composition of the coating was evaluated by ESCA (electron spectroscopy for chemical analysis) and Fourier transform infrared spectroscopy. The coating contained silicon and carbon in a ratio of 1.06, respectively and both techniques indicated about 1% of oxygen in the coating. The infrared spectra were consistent with the presence of some hydrogen in the films as both Si—H and C—H absorbances were detected.

EXAMPLE 3

This example illustrates an embodiment of the invention wherein the coating is formed on an article in a reactor containing a heater well or internally projecting "finger" to which the article to be coated is attached so that the article is heated essentially independently of other portions of the reactor apparatus.

A stainless steel tube containing 6-way cross, opposing ports was fitted with a heating well projecting into the 6-way cross about 1 mm from the center. The power electrode, a stainless steel disk, was positioned directly opposite the heating well via a high voltage feedthrough. A stainless steel screen was placed between the two opposing ports to limit the internal volume of the plasma during operation. A cylindrical 500 W cartridge heater mounted in a cylindrical copper block was inserted in the heater well. The article to be coated was mounted on the underside of the heater well within the tube. The heater well and attached article act as the plasma counter electrode and are held at ground potential during operation. The reactor was positioned so that the article to be coated was in an inverted alignment to minimize powder deposition on the surface of the article.

One end of the tube was fitted with a vapor feed system including mass flow meters so that the flow rate of multiple vapor feeds could be independently controlled. The tube was also fitted with sensors to monitor the pressure within the reactor. The other end of the tube was connected to a vacuum system employing a turbomolecular pump with a capacity of 150 L/s.

A Corning 7059 glass slide was mounted in the reactor and heated to 350° C. A vacuum was applied until a background pressure level of about $1 \times 10^{-6}$ torr was established. A flow rate of 10 standard cc/min of silacyclobutane was passed through the tube for 1 hr at a pressure of 0.2 torr while a plasma discharge at 125 kHz and power density of 0.25 w/cm$^2$ was sustained. After completion of the deposition, the reactor was backfilled with nitrogen and the coated slide removed.

The slide contained a well adhered coating 2180 nm in thickness. The electrical conductivity of the coating was $2.0 \times 10^{-13}$ S/cm and its optical band gap was 2.13 eV.

EXAMPLE 4

Using the procedure of Example 1 except that the plasma frequency was 13.56 MHz and the flow rate of silacyclobutane and argon was each 10 standard cc/min, a coating was deposited on a silicon wafer containing an aluminum grid on its surface. A coating layer of 70 nm thickness was formed on the wafer. The coated wafer was then tested for resistance to corrosive materials as described in Example 1 and there was no indication of pinholes, loss of adhesion or other perceptible effect on either the coating or aluminum metallization layer.

EXAMPLE 5

Using the procedure of Example 1 except that the reactor temperature was 250° C. and the flow of argon was omitted, a coating was deposited on a silicon wafer containing an aluminum grid on its surface. A coating layer of 700 nm thickness was formed on the wafer. The coated wafer was then tested for resistance to corrosive materials as described in Example 1 and there was no indication of pinholes, loss of adhesion or other perceptible effect on either the coating or aluminum metallization layer. The electrical conductivity of the film was $1.2 \times 10^{-15}$ S/cm. A Si/C/O ratio (atom %) of 46/53/1 for the film was determined by ESCA.

EXAMPLE 6

This example illustrates the effect that the temperature of deposition has on the composition and corrosion resistance of a coating produced by the method of this invention. Using the procedure of Example 1 except that the reactor was not externally heated, a coating was deposited on a silicon wafer containing an aluminum grid on its surface. The temperature of the wafer was estimated as about 40° C. during the deposition. A coating layer of 7500 nm thickness was formed on the wafer. Infrared spectra of the film indicated the presence of relatively large amounts of Si—O, Si—H and C—H bonds in comparison to films deposited at temperatures of 250° and 350° C. The coated wafer was then tested for resistance to corrosive materials as described in Example 1. The coating did not provide protection against the test mixture and did not survive the test conditions.

EXAMPLE 7

Using the procedure of Example 3 except that the chemical vapor passed through the reactor was 1,1-difluorosilacyclobutane, a coating was deposited on a silicon wafer. A coating layer of 400 nm thickness was formed on the wafer. IR spectra (Fourier transform) of the deposited film indicated that much of the ring structure of the parent compound had been destroyed, but that Si—H, Si—F and di- and trialkylsilyl groups were present in the film.

EXAMPLE 8

Using the procedure of Example 3 except that the chemical vapor passed through the reactor was 1,3-disilacyclobutane and the deposition was carried out for 30 min, a coating was deposited on a silicon wafer. A coating layer of 1370 nm thickness was formed on the wafer. The film had a dark conductivity of less than or equal to $3 \times 10^{-13}$ S/cm and had an optical band gap estimated at 2.25 eV.

EXAMPLE 9

Using the procedure of Example 3 except that the chemical vapor passed through the reactor was 1,1,3,3-tetramethylsilacyclobutane, a coating was deposited on a silicon wafer. A coating layer of 600 nm thickness was formed on the wafer. The coating had a dark conductivity of $1.7 \times 10^{-12}$ S/cm and very low absorption of visible light.

EXAMPLE 10

This example illustrates that the coatings of this invention may be applied over other protective coating to further enhance the corrosion resistance beyond that provided by the base coating. Six CMOS 4011 integrated circuit devices were first coated with a 150 nm thick silica coating formed by pyrolysis in air at 400° C. for 1 hr of a platinum catalyzed (131 ppm Pt as Pt (II) acetylacetonate based on resin) hydrogen silsesquioxane resin coating deposited on the devices by spin coating of a 10% resin solution in heptane solvent. The preparation of hydrogen silsesquioxane resin is described in U.S. Pat. No. 3,615,272.

Three of the devices were then further coated by the procedure described in Example 1. The six devices were subjected to a salt spray corrosion test as described in MIL-STD 883C Method 1009.3. Typically, uncoated CMOS devices fail in 10 min or less in this test.

The six devices were removed intermittently and checked to determine if they were still functional. The three samples containing only the silica coating failed within the first two hours of salt spray testing. The three samples containing the additional coating formed by the process of this invention were functional for 6, 12 and 20 hours respectively.

EXAMPLE 11

This example illustrates the use of microwave frequencies to form a plasma discharge suitable for use in the method of this invention. Both an unmodified silicon wafer and a silicon wafer containing an aluminum interdigitated pattern on its surface were placed in a chamber and attached to a heating device. The chamber contained an electron cyclotron resonance source positioned to generate a plasma in the region about 3 cm above the silicon wafers. The silicon wafers were heated to about 200° C. and the chamber evacuated. A flow of 20 standard cc/min of silacyclobutane was passed through the chamber for 10 min at a pressure of 0.01 torr while a plasma discharge at 2.45 GHz with a power density of about 0.4 w/cm$^2$ was maintained.

The wafers removed from the chamber contained an adherent coating of 3800 nm thickness. The coated wafer having the aluminum interdigitated pattern was tested in the corrosive mixture as described in Example 1. There was no indication of pinholes, loss of adhesion or other perceptible effect on either the coating or aluminum metallization layer.

EXAMPLE 12

This example illustrates the use of hydrogen in combination with a silacyclobutane source gas to modify the composition of the coating deposited by the method of this invention.

A silicon wafer was coated using the procedure of Example 11 except that the vapor introduced into the chamber consisted of 2% silacyclobutane and 98% hydrogen. Flow of this vapor mixture was continued for 30 min to produce a coating of 140 nm thickness on the silicon wafer. Fourier transform infrared spectra of the deposited film did not contain significant absorbances in the region associated with Si—H and C—H indicating that hydrogen was essentially absent from this film.

The invention claimed is:

1. A method of forming a continuous coating on a structure, the method comprising:

introducing sufficient quantity of a vapor into an evacuated chamber containing the structure to provide a vapor pressure in the chamber of 0.001 to 300 Torr, the vapor comprising a silicon-containing cyclobutane selected from the group consisting of silacyclobutanes represented by the formula

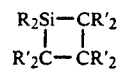

and 1,3-disilacyclobutanes represented by the formula

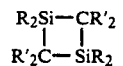

where, in both formulas, each R is independently selected from the group consisting of hydrogen, fluorine, and hydrocarbon radicals having 1 to 4 carbon atoms and each R' is independently selected from the group consisting of hydrogen and hydrocarbon radicals having 1 to 4 carbon atoms;

inducing decomposition of the silicon-containing cyclobutane in the chamber by effecting a plasma discharge within the chamber containing the structure.

2. The method according to claim 1 wherein the vapor is continuously introduced into and drawn out of the chamber to obtain a flow of vapor through the chamber and the plasma discharge is produced by alternating or direct current.

3. The method according to claim 2 wherein the temperature of the structure is 20° to about 600° C.

4. The method according to claim 2 wherein the temperature of the structure is 200° to 350° C.

5. The method according to claim 1 wherein the vapor is continuously introduced into and drawn out of the chamber to obtain a flow of vapor through the chamber and the frequency of the plasma discharge is in the range of about 25 KHz to about 3 GHz.

6. The method according to claim 5 wherein the temperature of the structure is 20° to about 600° C.

7. The method according to claim 6 wherein the structure is positioned within the plasma discharge.

8. The method according to claim 7 wherein the vapor comprises the silicon-containing cyclobutane and hydrogen gas.

9. The method according to claim 7 wherein the silicon-containing cyclobutane is silacyclobutane and the temperature of the structure is 200° to 350° C.

10. The method according to claim 6 wherein the structure is positioned proximate to the plasma discharge at a point down-flow from the area of plasma discharge.

11. The method according to claim 6 wherein the vapor comprises the silicon-containing cyclobutane and a diluent gas which is inert under the conditions of the decomposition of the silicon-containing cyclobutane.

12. The method according to claim 6 wherein the silicon-containing cyclobutane is silacyclobutane.

13. The method according to claim 5 wherein the temperature of the structure is 200° to 350° C.

14. The method according to claim 13 wherein the silicon-containing cyclobutane is silacyclobutane.

* * * * *